United States Patent
Lee

(10) Patent No.: US 12,085,253 B2
(45) Date of Patent: Sep. 10, 2024

(54) HEADLAMP DEVICE

(71) Applicant: SEOUL SEMICONDUCTOR CO., LTD., Ansan-si (KR)

(72) Inventor: Chung Hoon Lee, Ansan-si (KR)

(73) Assignee: SEOUL SEMICONDUCTOR CO., LTD., Ansan-si (KR)

( * ) Notice: Subject to any disclaimer, the term of this patent is extended or adjusted under 35 U.S.C. 154(b) by 0 days.

(21) Appl. No.: 18/451,993

(22) Filed: Aug. 18, 2023

(65) Prior Publication Data

US 2024/0125448 A1    Apr. 18, 2024

Related U.S. Application Data

(63) Continuation of application No. 17/788,699, filed as application No. PCT/KR2020/018851 on Dec. 22, 2020, now Pat. No. 11,767,961.

(30) Foreign Application Priority Data

Dec. 23, 2019  (KR) .................. 10-2019-0172841

(51) Int. Cl.
   *F21S 41/663*  (2018.01)
   *F21S 41/153*  (2018.01)
   *F21S 41/176*  (2018.01)

(52) U.S. Cl.
   CPC ........... *F21S 41/663* (2018.01); *F21S 41/153* (2018.01); *F21S 41/176* (2018.01)

(58) Field of Classification Search
   CPC ..... F21S 41/153; F21S 43/16; F21Y 2115/00; F21Y 2115/10; F21Y 2115/15; F21Y 2115/20; F21Y 2115/30
   See application file for complete search history.

(56) References Cited

U.S. PATENT DOCUMENTS 9,308,858 B2   4/2016   Cho et al.
9,974,135 B1   5/2018   Nelson et al.
(Continued)

FOREIGN PATENT DOCUMENTS

DE   102018203497 A1   9/2019
EP       2677232 A1    12/2013
(Continued)

OTHER PUBLICATIONS

Search Report from corresponding related European Patent Application No. 20907529.0 dated Jul. 10, 2023 (9 pages).

*Primary Examiner* — Robert J May
(74) *Attorney, Agent, or Firm* — Perkins Coie LLP

(57) ABSTRACT

A headlamp device includes a headlamp, an object detector, and a controller. The headlamp is mounted on a vehicle and includes a light emitting unit composed of multiple light emitting cells. The object detector detects an object around the vehicle and generates an object detection signal including object coordinates corresponding to a location of the detected object. The controller controls light of the headlamp based on information on the object coordinates. The controller may control the light emitting unit such that at least some light emitting cells are turned off according to an object detection signal. Each of multiple light emitting units includes a circuit board, the multiple light emitting cells separated from each other on the circuit board, a molding member formed between the light emitting structures, and a protective member formed on the molding member to surround sides of the multiple wavelength conversion members while filling a gap between the multiple wavelength conversion members

20 Claims, 8 Drawing Sheets

(56) References Cited

U.S. PATENT DOCUMENTS

| | | |
|---|---|---|
| 2010/0191418 A1 | 7/2010 | Mimeault et al. |
| 2011/0121731 A1 | 5/2011 | Tsutsumi et al. |
| 2013/0329440 A1 | 12/2013 | Tsutsumi et al. |
| 2016/0148912 A1* | 5/2016 | Higashino ............ H01L 25/0753 257/91 |
| 2023/0025844 A1 | 1/2023 | Lee |

FOREIGN PATENT DOCUMENTS

| | | |
|---|---|---|
| EP | 3267097 A1 | 1/2018 |
| JP | 2014197690 A | 10/2014 |
| JP | 2016132444 A | 7/2016 |
| KR | 20160148090 A | 12/2016 |
| KR | 20180018938 A | 2/2018 |
| KR | 101846329 B1 | 4/2018 |
| WO | 2014090893 A1 | 6/2014 |
| WO | 2019170270 A1 | 9/2019 |

* cited by examiner

[FIG. 1]
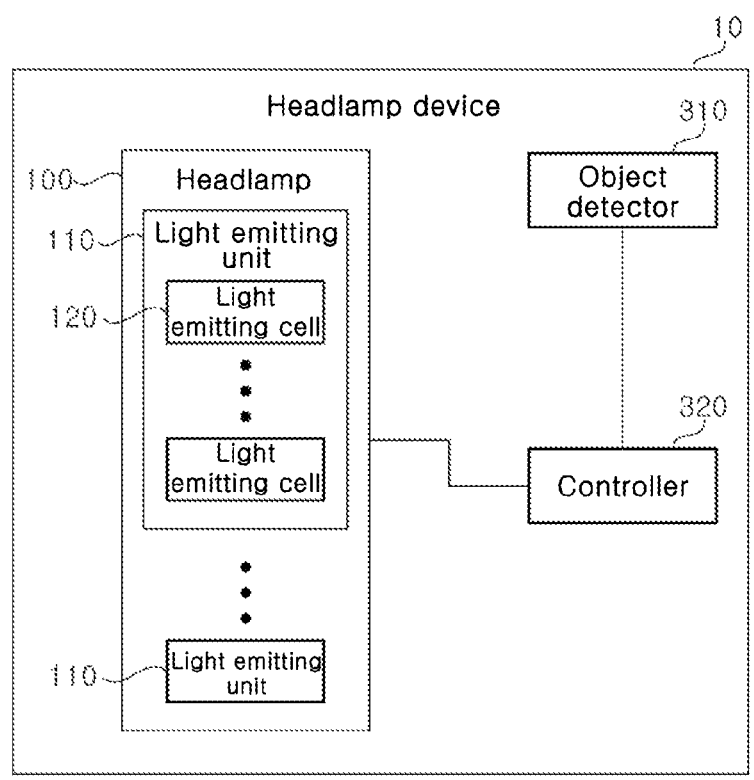

[FIG. 2]
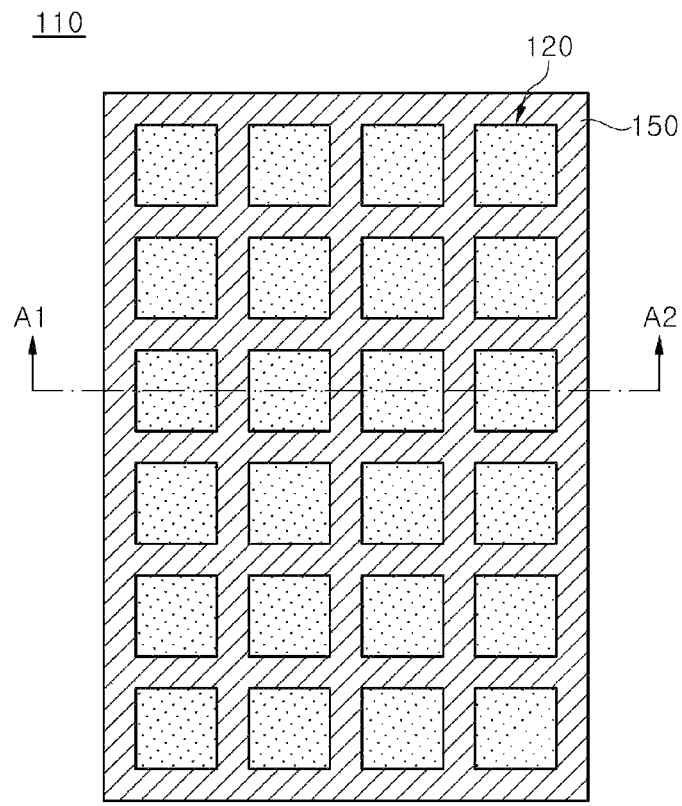
[FIG. 3]
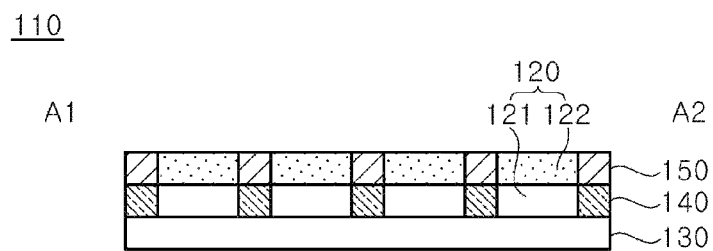

[FIG. 4]
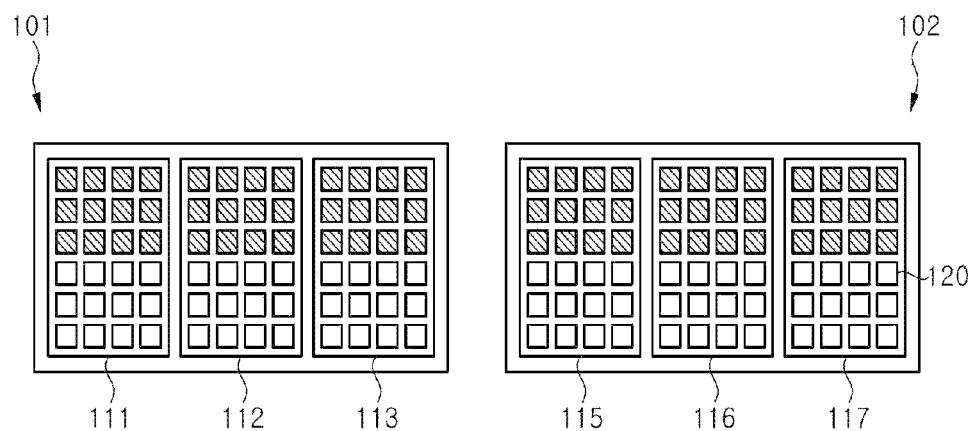
[FIG. 5]
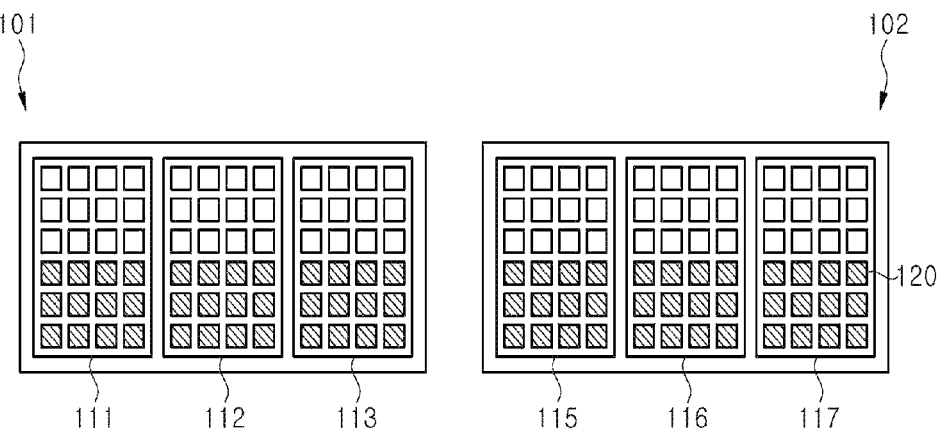

[FIG. 6]
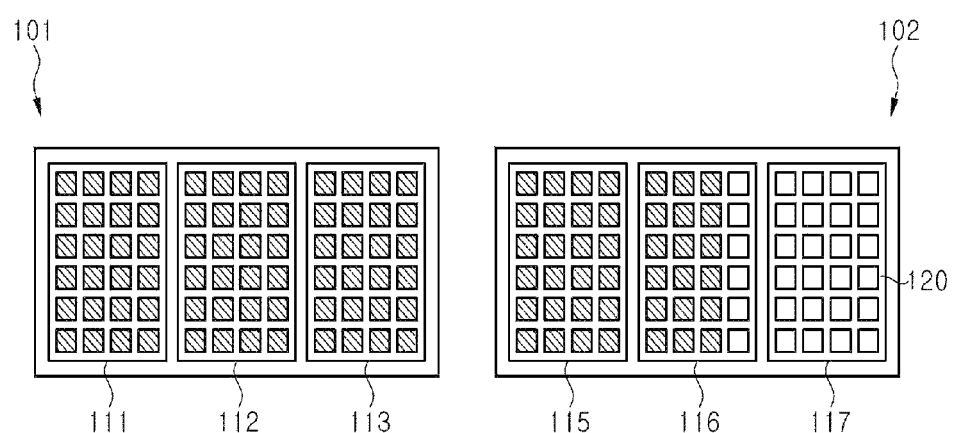

[FIG. 7]
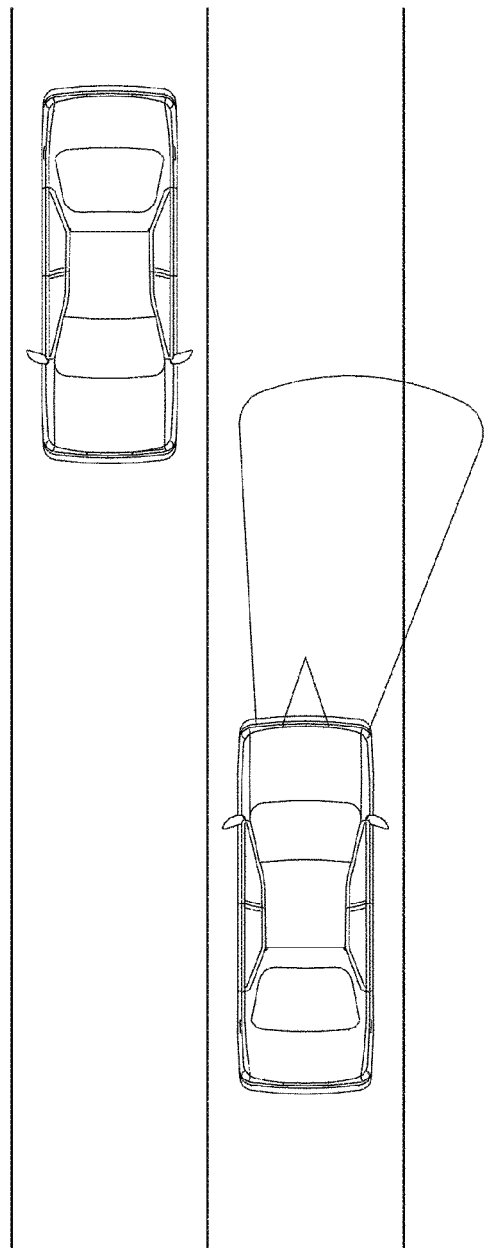

[FIG. 8]
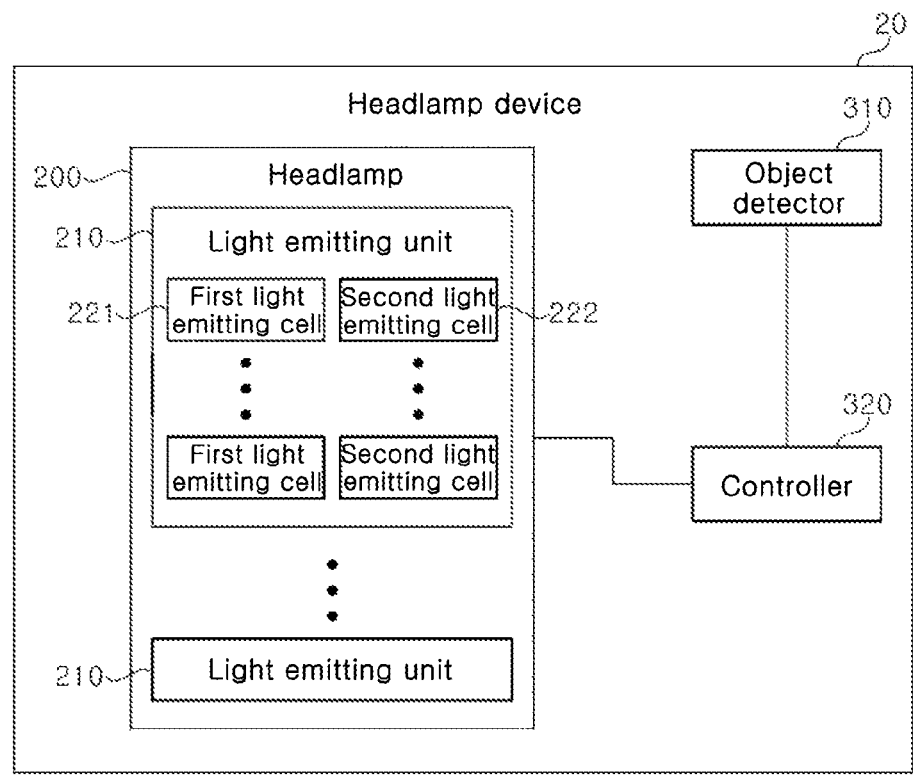
[FIG. 9]
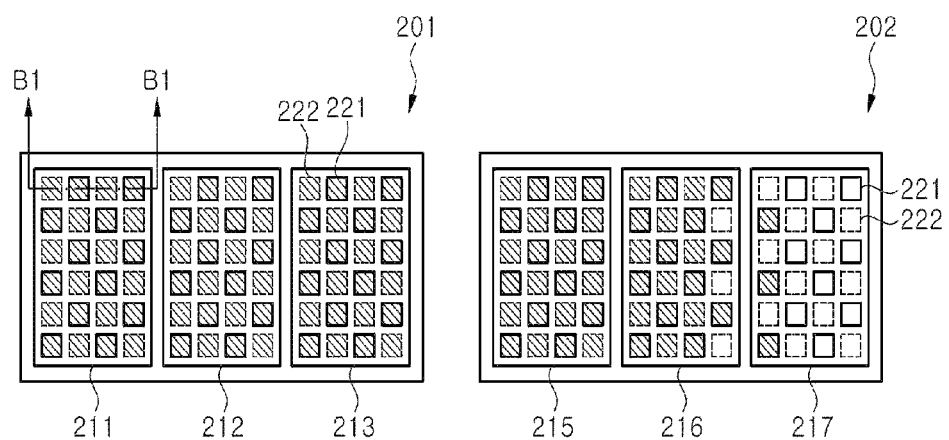

[FIG. 10]
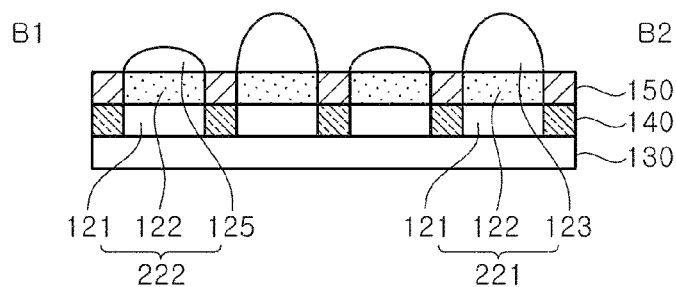

[FIG. 11]
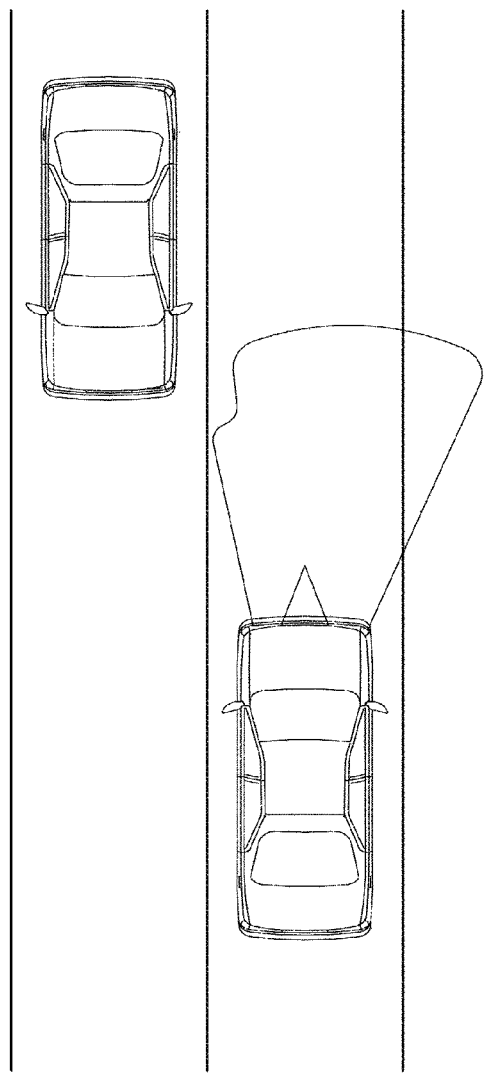

HEADLAMP DEVICE

CROSS-REFERENCE TO RELATED APPLICATIONS

This patent document is a continuation of U.S. patent application Ser. No. 17/788,699, filed on Jun. 23, 2022, which is a 371 National Phase application of International Patent Application No. PCT/KR2020/018851, filed Dec. 22, 2020, which further claims priority to and the benefit of Korean Patent Application No. 10-2019-0172841, filed Dec. 23, 2019. The entire contents of the above noted applications are incorporated by reference as part of the disclosure of this document.

TECHNICAL FIELD

The present invention relates to a headlamp device.

BACKGROUND ART

In general, a vehicle is provided with a lamp having a lighting function for easily identifying an object around the vehicle during night driving, and a signal function for notifying other vehicles or road users of a driving state of the vehicle. For example, headlamps and fog lights are used for lighting purposes, and turn indicators, taillights, brake lights, and side markers are used for signaling purposes.

When a vehicle driver drives at night or in a tunnel with low light intensity, the driver can safely drive through discrimination of front and rear sides of the vehicle using light irradiated from a light source in a headlamp of the vehicle.

In recent years, a method of securing a driver's visual field by adjusting an irradiation direction of a vehicle headlamp device based on vehicle driving information, such as a driving speed, a rotation angle of wheels, and the like, is studied in the art.

However, light for securing the driver's visual field may be delivered from the headlamp device toward a passersby or drivers of other vehicles driving in the vicinity of the driver's vehicle. As a result, the light from the headlamp device can obstruct the visual field of the passersby or drivers of the other vehicles, thereby causing an accident.

DISCLOSURE

Technical Problem

Embodiments of the present invention provide a headlamp device capable of detecting an object around a driver's vehicle while controlling light traveling towards the object.

Embodiments of the present invention provide a headlamp device capable of preventing obstruction of the visual fields of other vehicle drivers or passersby.

Technical Solution

One embodiment of the present invention provides a headlamp device including a headlamp, an object detector, and a controller.

The headlamp is mounted on a vehicle and includes a light emitting unit composed of multiple light emitting cells. The object detector detects an object around the vehicle and generates an object detection signal including object coordinates corresponding to a location of the detected object. The controller controls light of the headlamp based on information on the object coordinates. The controller may control the light emitting unit such that at least some light emitting cells are turned off according to an object detection signal.

In addition, each of multiple light emitting units includes a circuit board, multiple light emitting cells separated from each other on the circuit board, a molding member, and a protective member. Each of the light emitting cells includes a light emitting structure and a wavelength conversion member formed on the light emitting structure. The molding member is formed between the light emitting structures. In addition, the protective member is formed on the molding member. Here, the protective member surrounds sides of the multiple wavelength conversion members and fills a gap between the multiple wavelength conversion members.

Advantageous Effects

The headlamp device according to the embodiments can detect an object around a driver's vehicle while controlling light traveling towards the object.

Accordingly, the headlamp device can prevent obstruction of the visual fields of other vehicle drivers or passersby, thereby preventing an accident due to vehicle lighting.

DESCRIPTION OF DRAWINGS

FIG. 1 is a schematic block diagram of a headlamp device according to one embodiment of the present invention.

FIG. 2 and FIG. 3 are schematic views of a light emitting unit according to one embodiment of the present invention.

FIG. 4 to FIG. 7 are views illustrating examples of various operation of a headlamp according to one embodiment of the present invention.

FIG. 8 is a schematic block diagram of a headlamp device according to another embodiment of the present invention.

FIG. 9 is a schematic view of a headlamp including a first headlamp and a second headlamp according to another embodiment of the present invention.

FIG. 10 is a schematic view of a light emitting unit according to another embodiment of the present invention.

FIG. 11 is a view illustrating an object detection state of a headlamp device according to another embodiment of the present invention.

BEST MODE

Hereinafter, embodiments of the present invention will be described with reference to the accompanying drawings. It should be understood that the following embodiments are provided for complete disclosure and thorough understanding of the present invention by those skilled in the art. Therefore, the present invention is not limited to the following embodiments and may be embodied in different ways. In addition, the drawings may be exaggerated in width, length, and thickness of components for descriptive convenience and clarity only. Like components will be denoted by like reference numerals throughout the specification.

A headlamp device includes a headlamp, an object detector, and a controller. The headlamp is mounted on a vehicle and includes a light emitting unit composed of multiple light emitting cells. The object detector detects an object around the vehicle and generates an object detection signal including object coordinates corresponding to a location of the detected object. The controller controls light of the headlamp based on information on the object coordinates.

The controller may control the light emitting unit such that at least some light emitting cells are turned off according to an object detection signal.

Each of multiple light emitting units includes a circuit board, the multiple light emitting cells separated from each other on the circuit board, a molding member, and a protective member. Each of the light emitting cells includes a light emitting structure and a wavelength conversion member formed on the light emitting structure. The molding member is formed between the light emitting structures. In addition, the protective member is formed on the molding member. Here, the protective member surrounds sides of the multiple wavelength conversion members and fills a gap between the multiple wavelength conversion members.

In one embodiment, the protective member may be formed with a through-hole at a location thereof corresponding to each of the multiple light emitting structures. Here, the wavelength conversion member fills the through-hole of the protective member.

The wavelength conversion member may include a light transmitting resin and a wavelength conversion material dispersed in the light transmitting resin.

The light transmitting resin may be an epoxy resin or a silicone resin.

The wavelength conversion material may include phosphors or quantum dots.

In another embodiment, the protective member may be integrally formed with the wavelength conversion member. For example, the wavelength conversion member may be placed in each of regions of the protective member corresponding to the multiple light emitting structures. Here, the phosphors are dispersed in each of the regions of the protective member. The molding member may be a black EMC (epoxy molding compound) or black PDMS (polydimethylsiloxane).

The protective member may be formed of a glass material or a ceramic material.

In one embodiment, the controller may turn off light emitting cells disposed in an upper region of the light emitting unit in response to the object detection signal.

In another embodiment, the controller may turn off the light emitting cells corresponding to at least the object coordinates in response to the object detection signal.

The light emitting cells may include a first light emitting cell and a second light emitting cell having different beam angles.

Each of the multiple light emitting units includes both the first light emitting cell and the second light emitting cell.

The first light emitting cell may include the light emitting structure, the wavelength conversion member, and a first lens disposed on the wavelength conversion member.

The second light emitting cell may include the light emitting structure, the wavelength conversion member, and a second lens disposed on the wavelength conversion member.

The first lens and the second lens may have different beam angles.

The first light emitting cell may have a greater beam angle than the second light emitting cell.

The second light emitting cell may have a longer lighting distance than the first light emitting cell.

In one embodiment, the controller may turn off the first light emitting cell and the second light emitting cell corresponding to the object coordinates in response to the object detection signal.

The controller may turn off the second light emitting cell adjacent to the light emitting cell corresponding to the object coordinates.

In another embodiment, the controller may turn off the second light emitting cell in response to the object detection signal.

When the detected object disappears, the controller may allow the light emitting cells in a turned-off state to return to a state before the object is detected.

Hereinafter, a headlamp device according to embodiments of the present invention will be described in detail.

FIG. 1 to FIG. 6 are exemplary views of a headlamp device according to one embodiment of the present invention.

FIG. 1 is a schematic block diagram of a headlamp device according to one embodiment of the present invention.

Referring to FIG. 1, a headlamp device 10 according to one embodiment includes an object detector 310, a controller 320, and a headlamp 100. The headlamp 100 may be composed of at least one light emitting unit 110.

The object detector 310 detects an object appearing in a lighting area that is illuminated by the headlamp device. Here, lighting is realized by light emitted from the light emitting unit 110. In addition, the lighting area may be a maximum area illuminated by the headlamp device 10. For example, the lighting area may be placed in front of a driver's vehicle.

The object detector 310 is a camera adapted to photograph the front of the vehicle and may acquire images of the lighting area and a surrounding area of the lighting area.

The object detector 310 may determine the presence of an object in the lighting area of the driver's vehicle through the acquired images. When the object is present in the lighting area of the vehicle, a driver is required to pay attention to driving of the vehicle. For example, an object requiring the driver's attention may be a passerby, an animal, a vehicle and the like located in front of the driver's vehicle in a direction in which the driver's vehicle moves.

The object detector 310 may generate an object detection signal including information on the presence of an object in the lighting area through analysis of the acquired images.

The object detector 310 may calculate object coordinates through coordination of a location of the object in the lighting area based on the acquired images.

That is, the object detection signal may include only information on the presence of an object in the lighting area or both information on the presence of the object and the object coordinates of the object.

For example, upon detecting an object in the lighting area, the object detector 310 may calculate the object coordinates and may send the object detection signal including the object coordinates to the controller 320.

In addition, upon detecting no object in the lighting area, the object detector 310 may send an object detection signal including information indicating that no object is detected in the lighting area to the controller 320.

In this embodiment, a camera adapted to take an image of the front of the vehicle is provided as the object detector 310. However, it should be understood that the object detector 310 is not limited thereto and may be realized by any device capable of detecting an object in front of the vehicle. For example, the object detector 310 may be realized by anything capable of detecting the location, distance and size of an object, such as a camera, radar, infrared beams, ultrasonic waves, and the like.

The controller 320 controls the light emitting unit 110 in response to the object detection signal received from the object detector 310.

The controller 320 generates a lighting control signal to control lighting of the headlamp 100 in response to the object detection signal.

The lighting control signal may include information on light emitting cells 120 in a turned-off state and in a turn-on state among the light emitting cells 120. For example, the lighting control signal may include position information of the light emitting cells 120 to be turned off and position information of the light emitting cells 120 to be turned on.

For example, upon receiving the object detection signal including the object coordinates, the controller 320 may control the light emitting cells 120 corresponding to the object coordinates to be turned off while controlling other light emitting cells 120 to be turned on.

Further, upon receiving the object detection signal including information not including the object coordinates or the information indicating that no object is detected in the lighting area, the controller 320 may control the light emitting cells 120 to be kept in a current state or to return to a previous state.

For example, when all of object detection signals previously received by the controller 320 include the information indicating that no object is detected in the lighting area, the controller 320 may control each of the light emitting cells 120 to be kept a current state.

Further, upon receiving the information indicating that no object is detected in the lighting area immediately after receiving the information on the object coordinates, the controller 320 may control each of the light emitting cells 120 to return to a previous state before receiving the information on the object coordinates.

For example, the headlamp device 10 may be in a state that all of the light emitting cells 120 are turned on. Thereafter, upon detecting an object in the lighting area, the headlamp device 10 allows the light emitting cells 120 disposed to emit light towards the object to be turned off.

Thereafter, when the object disappears in the lighting area, the headlamp device 10 may allow all of the light emitting cells 120 to return to a state before the object is detected. That is, the headlamp device 10 may allow all of the light emitting cells 120 to emit light again.

The light emitting unit 110 includes multiple light emitting cells 120.

Light emitting operation of the multiple light emitting cells 120 may be individually performed. That is, each of the light emitting cells 120 may be turned on or turned off in response to a lighting control signal sent from the controller 320.

According to the lighting control signal, among the multiple light emitting cells 120, light emitting cells 120 disposed corresponding to the object coordinates may be turned off. In addition, according to the lighting control signal, among the multiple light emitting cells 120, light emitting cells 120 excluding the light emitting cells 120 disposed corresponding to the object coordinates may be turned on or kept in a current state.

FIG. 2 and FIG. 3 are exemplary schematic views of a light emitting unit 110 according to one embodiment of the present invention.

Referring to FIG. 2 and FIG. 3, the light emitting unit 110 includes a circuit board 130, multiple light emitting structures 121, a molding member 140, a wavelength conversion member 122, and a protective member 150.

The multiple light emitting structures 121 are disposed on the circuit board 130. In this embodiment, each of the light emitting cells 120 is composed of the light emitting structure 121 and the wavelength conversion member 122 disposed on the light emitting structure 121.

For example, the light emitting structure 121 may be a light emitting diode that includes a growth substrate and semiconductor layers formed on the growth substrate. For example, the growth substrate may be a sapphire substrate. The semiconductor layers may include a first conductivity type semiconductor layer, a second conductivity type semiconductor layer, and an active layer interposed between the first conductivity type semiconductor layer and the second conductivity type semiconductor layer.

The light emitting structure 121 may further include electrodes electrically connected to the first conductivity type semiconductor layer and the second conductivity type semiconductor layer, respectively.

The multiple light emitting structures 121 are spaced apart from each other. For example, a distance between adjacent light emitting structures 121 may be in the range of 20 μm to 50 μm. If the distance between the light emitting structures 121 is less than 20 μm, light emitting areas can overlap each other between adjacent light emitting structures 121. Here, there can be a problem that light emitted from the light emitting structure 121 in a turned-on state reaches a turned-off area.

If the distance between the light emitting structures 121 exceeds 50 μm, the molding member 140 between the light emitting structures 121 can be observed with the naked eye.

In another embodiment, the light emitting structure 121 may be composed of semiconductor layers from which the growth substrate is removed. Here, the multiple light emitting structures 121 may share the first conductivity type semiconductor layer and may have a structure in which multiple mesas each composed of the active layer and the second conductivity type semiconductor layer are spaced apart from each other.

Here, the light emitting structure may include a common electrode electrically connected to the first conductivity type semiconductor layer and multiple individual electrodes formed on the mesas to be electrically connected to the second conductivity type semiconductor layers, respectively.

In another embodiment, the multiple light emitting structures 121 may share a single growth substrate. For example, multiple semiconductor layers may be formed on one growth substrate. Here, the light emitting structures 121 may be realized by regions formed with the semiconductor layers or the semiconductor layers each including the growth substrate, respectively.

The circuit board 130 may be a substrate formed with interconnection wires to be connected to the light emitting structures 121. The interconnection wires may be formed to allow individual operation of the multiple light emitting structures 121.

That is, the interconnection wires of the circuit board 130 may be electrically connected to the electrodes formed on the multiple light emitting structures 121 to allow individual operation of the multiple light emitting structures 121.

Thus, the multiple light emitting structures 121 may be individually operated in response to external signals received through the circuit board 130.

The molding member 140 may fill a space between the light emitting structures 121. The molding member 140 may be formed of black molding to prevent or minimize interference of light between adjacent light emitting structures 121. For example, the black molding may be a black EMC (epoxy molding compound) or black PDMS (polydimethylsiloxane).

By such a molding member 140, a region irradiated with light emitted from each of the light emitting structures 121 is limited to a particular range.

Accordingly, the headlamp device 10 may allow light emitted from the light emitting structures 121 to be delivered to a particular region or not to be delivered thereto by controlling light emitting operation and non-light emitting operation of each of the light emitting structures 121. That is, the headlamp device 10 may allow accurate control of a light irradiation region.

According to this embodiment, the wavelength conversion member 122 is disposed on each of the light emitting structures 121 and the protective member 150 is formed to surround a side surface of each of the wavelength conversion members 122. That is, a space between the wavelength conversion members 122 is filled with the protective member 150. Accordingly, the wavelength conversion material may be formed to cover an upper portion of the light emitting structure 121 and the protective member 150 may be formed to cover an upper portion of the molding member 140.

The wavelength conversion member 122 may convert the wavelength of some fractions of light emitted from the light emitting structure 121. The light emitting unit 110 may emit light of a preset color by mixing light emitted from the light emitting structure 121 with light subjected to wavelength conversion by the wavelength conversion member.

The wavelength conversion member 122 may be composed of a light transmitting resin and a wavelength conversion material dispersed in the light transmitting resin. For example, the light transmitting resin may be an epoxy resin or a silicone resin. Further, the wavelength conversion material may be a phosphor or a quantum dot (QD).

Alternatively, the wavelength conversion member 122 may be composed of glass containing the wavelength conversion material dispersed therein. For example, the wavelength conversion member 122 may be phosphor-in-glass (PIG).

The protective member 150 prevents foreign matter, such as moisture, gas, dust, and the like, from entering the light emitting structure 121 or the wavelength conversion member 122. The protective member 150 may prevent deterioration in luminous efficacy by preventing degradation of the light emitting structures 121 and the wavelength conversion members 122.

For example, the protective member 150 may be formed of a glass material.

In one embodiment, the protective member 150 may be formed with a through-hole at a location corresponding to each of the light emitting structures 121. The wavelength conversion member 122 may be formed to fill the corresponding through-hole formed in the protective member 150.

For example, first, the protective member 150 formed of glass may be formed with the through-hole using a laser beam. The through-hole may be formed at a location corresponding to each of the light emitting structures 121. Thereafter, the wavelength conversion member 122 may be inserted into the through-hole of the protective member 150.

Referring to FIG. 2 and FIG. 3, the through-hole of the protective member 150 may have the same area as the light emitting structure 121. That is, a lower surface of the wavelength conversion member 122 has the same area as an upper surface of the light emitting structure 121.

However, it should be understood that the present invention is not limited to the structure wherein the lower surface of the wavelength conversion member 122 has the same area as the upper surface of the light emitting structure 121.

For example, the through-hole of the protective member 150 may have the same area as the upper surface of the light emitting structure 121. Accordingly, the lower surface of the wavelength conversion member 122 may have a smaller or greater area than the upper surface of the light emitting structure 121. For a structure wherein the lower surface of the wavelength conversion member 122 has a smaller area than the upper surface of the light emitting structure 121, it is possible to improve concentration of light.

Furthermore, although the wavelength conversion member 122 and the protective member 150 are formed of different materials and are provided as independent components in this embodiment, it should be understood that the present invention is not limited thereto.

The protective member 150 and the wavelength conversion member 122 may be formed of the same material and provided as an integrated structure. For example, the protective member 150 may be provided in the form of a ceramic sheet. The protective member 150 contains phosphors in regions corresponding to the light emitting structures 121 such that light is dispersed while passing through the regions in which the phosphors are distributed. In this case, the protective member 150 may act as the wavelength conversion member 122 in the regions provided with the phosphors while protecting the light emitting structures 121. That is, the regions of the protective member 150 disposed on the light emitting structure 121 and provided with the phosphors may act as the wavelength conversion member 122.

The headlamp device 10 according to this embodiment prevents light from traveling towards a detected object upon detecting a passerby or another vehicle in front of the driver's vehicle. That is, the headlamp device 10 selects the light emitting cells 120 emitting light towards the detected object and other light emitting cells 120 adjacent thereto among the multiple light emitting cells 120 and controls the corresponding light emitting cells 120 so as not to emit light.

In this embodiment, the headlamp device 10 may control only the light emitting cells 120 corresponding to the object coordinates to be turned off. However, the visual fields of other vehicle drivers or passersby can be obstructed by light emitted from the light emitting cells corresponding to the object coordinates and other light emitting cells 120 adjacent thereto.

Thus, the headlamp device 10 may turn off not only the light emitting cells 120 corresponding to the object coordinates but also other light emitting cells 120 adjacent thereto so as not to emit light.

Alternatively, the headlamp device 10 reduces the quantity of light emitted from the selected light emitting cells 120.

Accordingly, the headlamp device 10 according to the present invention can prevent passersby or other vehicle drivers in front of the driver's vehicle from suffering from glare due to lighting of the vehicle or from obstruction of the field of view due to glare. Furthermore, the headlamp device 10 can prevent passersby or other vehicle drivers in front of the driver's vehicle from suffering an accident due to obstruction of the visual field by light emitted from the driver's vehicle.

FIG. 4 to FIG. 7 are exemplary views illustrating various operations of the headlamp 100 according to the embodiment of the present invention.

FIG. 4 to FIG. 6 schematically illustrate the headlamp 100 of a vehicle. For example, the headlamp 100 includes a first headlamp 101 and a second headlamp 102. The first headlamp 101 is placed at the right of the vehicle and the second headlamp 102 is placed at the left of the vehicle.

Each of the first headlamp 101 and the second headlamp 102 may be composed of multiple light emitting units 110. For example, the multiple light emitting units 110 of the first headlamp 101 include a first-1 light emitting unit 111, a first-2 light emitting unit 112, and a first-3 light emitting unit 113. In addition, the multiple light emitting units 110 of the second headlamp 102 includes a second-1 light emitting unit 115, a second-2 light emitting unit 116, and a second-3 light emitting unit 117.

Although each of the first headlamp 101 and the second headlamp 102 includes the multiple light emitting units 110 in this embodiment, each of the first headlamp 101 and the second headlamp 102 may be composed of a single light emitting unit including the multiple light emitting cells 120 in other embodiments.

FIG. 4 is an exemplary view of the headlamp 100 in a high beam state.

In this embodiment, upon receiving a high beam signal, the controller 320 may control each of the light emitting units 110 such that the headlamp 100 becomes a high beam state. That is, as shown in FIG. 4, the controller 320 may generate a lighting control signal allowing the light emitting cells 120 in an upper region of each of the light emitting units 110 to be turned on while allowing the light emitting cells 120 in a lower region thereof to be turned off.

Here, the upper region of the light emitting unit 110 is placed above a center or a central axis of the light emitting unit 110.

Accordingly, the multiple light emitting cells 120 of each of the light emitting units 110 may be turned on or off in response to the lighting control signal, as shown in FIG. 4.

Alternatively, the controller 320 may generate a lighting control signal allowing all of the light emitting cells 120 in each of the light emitting units 110 to be turned on in response to the high beam signal.

When the headlamp 100 is in the high beam state, the light emitting cells 120 placed in the upper region emit light, thereby enabling illumination of a long distance from the driver's vehicle.

Upon detecting no object in front of the driver's vehicle, the headlamp device 10 may allow the headlamp 100 to become the high beam state.

FIG. 5 is an exemplary view of the headlamp 100 in a low beam state.

In this embodiment, upon receiving a low beam signal, the controller 320 may control each of the light emitting units 110 such that the headlamp 100 becomes a low beam state. That is, as shown in FIG. 5, the controller 320 may generate a lighting control signal that allows the light emitting cells 120 in an upper region of each of the light emitting units 110 to be turned off while allowing the light emitting cells 120 in a lower region thereof to be turned on.

Here, the lower region of the light emitting unit 110 is placed below the center or the central axis of the light emitting unit 110.

Accordingly, the multiple light emitting cells 120 of each of the light emitting units 110 may be turned on or off in response to the lighting control signal, as shown in FIG. 5.

When the headlamp 100 is in the low beam state, the light emitting cells 120 placed in the lower region emit light, thereby enabling illumination of a short distance from the driver's vehicle.

Although the headlamp can provide illumination of a long distance from the vehicle in the high beam state, light from the headlamp can obstruct the visual field of an oncoming vehicle, a vehicle or a passerby in front of the driver's vehicle.

Accordingly, the headlamp device 10 may allow the headlamp 100 to become the low beam state upon detecting an object, such as a vehicle or a passerby, in front of the drivers' vehicle.

The high beam signal and the low beam signal received by the controller 320 may be generated through an operating lever operated by the driver.

In addition, the controller 320 may generate a lighting control signal by combining a signal from the operating lever with an object detection signal from the object detector 310.

For example, the controller 320 may control the headlamp 100 to become the high beam state in response to the signal from the operating lever. Thereafter, the controller 320 may generate a lighting control signal to allow the headlamp 100 to become the low beam state upon receiving object coordinate information from the object detector 310. Thereafter, the controller 320 may generate a lighting control signal to allow the headlamp 100 to return to the high beam state upon receiving information indicating that there is no detected object in the lighting area.

FIG. 6 is an exemplary view of the headlamp 100 in an object detecting state.

Upon detecting an object in the lighting area, the headlamp device 10 may control the headlamp 100 so as not to deliver light to a region in which the object is placed.

For example, the object detector 310 may detect other vehicles approaching the driver's vehicle along a left lane of the driver's vehicle.

The object detector 310 may send an object detection signal including information on the object coordinates of the other vehicles to the controller 320.

The controller 320 may generate a lighting control signal allowing the light emitting cells 120 disposed to emit light towards a region, in which the other vehicles are placed, to be turned on based on the information on the object coordinates.

For example, the controller 320 may determine the light emitting cells 120 of the second-3 light emitting unit 117 and the light emitting cells 120 disposed in one column of the second-2 light emitting unit 116 as the light emitting cells 120 disposed to emit light towards the region, in which the other vehicles are placed, based on the information on the object coordinates. Here, the one column of the second-2 light emitting unit 116 may be composed of the light emitting cells 120 adjacent to the second-3 light emitting unit 117.

The controller 320 may generate the lighting control signal to allow some light emitting cells 120 of the second-2 light emitting unit 116 placed at the left of the second headlamp 102 and all of the light emitting cells 120 of the second-3 light emitting unit 117 to be turned off, as shown in FIG. 6.

Through this operation, the headlamp device 10 can prevent the risk of obstructing the visual fields of other vehicle drivers in the other lane while automatically illuminating the front of the driver's vehicle, as shown in FIG. 7.

The following description will focus on different features of other embodiments from the above embodiment. That is, description of the same features of the following embodiments as those of the above embodiment will be omitted or given in brief. Thus, for detailed description of the corresponding features, refer to the above description.

FIG. 8 to FIG. 11 are exemplary views of a headlamp device according to another embodiment of the present invention.

FIG. 8 is a block diagram of a headlamp device 20 according to another embodiment of the present invention.

Referring to FIG. 8, the headlamp device 20 includes a headlamp 200, an object detector 310, and a controller 320.

The headlamp 200 includes multiple light emitting units 210.

Each of the multiple light emitting units 210 includes multiple individually-operated light emitting cells.

In this embodiment, each of the multiple light emitting units 210 includes multiple first light emitting cells 221 and multiple second light emitting cells 222.

The first light emitting cells 221 have a different beam angle and lighting distance than the second light emitting cells 222.

FIG. 10 is an exemplary view of a light emitting unit according to another embodiment of the present invention.

Referring to FIG. 10, the light emitting unit 210 includes a circuit board 130, multiple light emitting structures 121, a molding member 140, a wavelength conversion member 122, a protective member 150, a first lens 123, and a second lens 125.

The first lens 123 or the second lens 125 is disposed above the multiple light emitting structures 121.

In this embodiment, the first light emitting cell 221 is composed of one light emitting structure 121, the wavelength conversion member 122 disposed on the light emitting structure 121, and the first lens 123 disposed above the light emitting structure 121. In addition, the second light emitting cell 222 is composed of the other light emitting structure 121, the wavelength conversion member 122 disposed on the other light emitting structure 121, and the second lens 125 disposed above the other light emitting structure 121.

By the first lens 123 and the second lens 125, the first light emitting cell 221 and the second light emitting cell 222 have different beam angles and lighting distances.

For example, the first light emitting cell 221 including the first lens 123 may have a greater beam angle than the second light emitting cell 222 including the second lens 125.

Alternatively, the second light emitting cell 222 may have a narrower beam angle and a greater lighting distance than the first light emitting cell 221.

In addition, the first lens 123 and the second lens 125 may have different radii of curvature. For example, the first lens 123 may have a greater radius of curvature than the second lens 125.

FIG. 9 and FIG. 11 are exemplary views of the headlamp 200 in an object detecting state.

Upon detecting an object in a lighting area, the headlamp device 20 may control the headlamp 200 so as not to deliver light to a region in which the object is placed.

Referring to FIG. 9, the headlamp 200 includes a first headlamp 201 placed at the right of the vehicle and a second headlamp 202 placed at the left of the vehicle. For example, the first headlamp 201 may be composed of a light emitting unit 211, a light emitting unit 212, and a light emitting unit 213, each of which includes the multiple first light emitting cells 221 and the multiple second light emitting cells 222. In addition, the second headlamp 202 may be composed of a light emitting unit 215, a light emitting unit 216, and a light emitting unit 217, each of which includes the multiple first light emitting cells 221 and the multiple second light emitting cells 222.

For example, other vehicles may approach the driver's vehicle along a left lane of the driver's vehicle, as shown in FIG. 11.

Upon detecting the other vehicles approaching the driver's vehicle, the object detector 310 may send an object detection signal to the controller 320.

The controller 320 may control the light emitting units 210 based on received information on object coordinates.

The controller 320 may control all of the first light emitting cells 221 and the second light emitting cells 222 disposed to emit light towards regions, in which the other vehicles are placed, to be turned off. For example, the first light emitting cells 221 and the second light emitting cells 222 in the second to fourth columns of the light emitting unit 217 may be the light emitting cells disposed to emit light towards the region in which the other vehicles are placed.

Accordingly, the controller 320 may control all of the first light emitting cells 221 and the second light emitting cells 222 in the second to fourth columns of the light emitting unit 217 in the second headlamp 102 to be turned off.

In addition, the controller 320 may turn off the second light emitting cells 222 around the first light emitting cell 221 and the second light emitting cell 222 turned off according to the object detection signal. For example, the controller 320 may turn off the second light emitting cells 222 in two columns adjacent to the light emitting cells turned off according to the object detection signal. Accordingly, only the first light emitting cells 221 having a smaller lighting distance than the second light emitting cells 222 are turned on around the first light emitting cells 221 and the second light emitting cells 222 turned off according to the object detection signal.

Referring to FIG. 9, in the fourth column of the light emitting unit 216 and the first column of the light emitting unit 217, the second light emitting cells 222 are turned off and the first light emitting cells 221 are turned on.

Accordingly, the headlamp device 20 may control lighting upon detecting other vehicles, as shown in FIG. 11.

Referring to FIG. 11, the headlamp device 20 may provide as much light as possible to the front of the driver's vehicle without illuminating other vehicles as much as possible.

That is, the headlamp device 20 according to this embodiment may secure the driver's visual field by illuminating the front of the driver's vehicle over as wide an area as possible without obstructing the visual fields of other vehicle drivers or passersby.

In addition, when the object detector detects an object, the controller 320 may allow only the first light emitting cells 221 to be turned on or return to a previous state while turning off all of the second light emitting cells 222. Accordingly, upon detecting an object in front of the vehicle, the headlamp device 20 can prevent obstruction of the visual field of the object due to vehicle lighting by allowing only the first light emitting cells 221 having a short lighting distance to be turned on.

Although some embodiments have been described herein, it should be understood that the foregoing embodiments are provided for illustration only and are not to be in any way construed as limiting the technical idea of the present invention. The scope of the present invention should be defined by the appended claims and equivalents thereto.

The invention claimed is:

1. A device for a vehicle, comprising:
a light emitting module including light emitting cells;

an object detector configured to detect an object around the vehicle and generate an object detection signal; and a controller configured to be connected to the light emitting module, wherein the controller is configured to control the light emitting module such that at least some of the light emitting cells are turned off according to the object detection signal, and wherein the light emitting module comprises:

a circuit board including interconnection lines;

the light emitting cells being separated from each other on the circuit board and each light emitting cell comprising a light emitting structure, an electrode, and a wavelength converter disposed on the light emitting structure, a protective layer surrounding side surfaces of the wavelength converter while filling a gap adjacent to the wavelength converter, wherein the interconnection lines are electrically connected to the light emitting cells.

2. The device according to claim 1, wherein the protective layer has through-holes at locations corresponding to each light emitting structures and the wavelength converter fills the through-holes of the protective layer.

3. The device according to claim 2, wherein the wavelength converter comprises a light transmitting resin and a wavelength conversion material dispersed in the light transmitting resin.

4. The device according to claim 3, wherein the light transmitting resin includes at least one of an epoxy resin or a silicone resin, and the wavelength converter comprises at least one of phosphors or quantum dots.

5. The device according to claim 1, wherein:

the protective layer is integrally formed with the wavelength converter;

the wavelength converter is placed in each of regions of the protective layer corresponding to light emitting structures; and phosphors are dispersed in each of the regions of the protective layer.

6. The device according to claim 1, further comprising a molding member including at least one of a black EMC (epoxy molding compound) or black PDMS (polydimethylsiloxane).

7. The device according to claim 1, wherein the protective layer includes at least one of a glass material or a ceramic material.

8. The device according to claim 1, wherein the controller is configured to turn off first light emitting cells disposed in an upper region of the light emitting module in response to the object detection signal.

9. The device according to claim 1, wherein the controller is configured to turn off second light emitting cells in response to the object detection signal.

10. The device according to claim 1, wherein the light emitting cells comprise a first light emitting cell and a second light emitting cell that have different beam angles from each other.

11. The device according to claim 10, wherein the light emitting module comprises both the first light emitting cell and the second light emitting cell.

12. The device according to claim 10, wherein:

the first light emitting cell comprises the light emitting structure, the wavelength converter, and a first lens disposed on the wavelength converter; and the second light emitting cell comprises the light emitting structure, the wavelength converter, and a second lens disposed on the wavelength converter, the first lens and the second lens that have different beam angles from each other.

13. The device according to claim 10, wherein the first light emitting cell has a greater beam angle than the second light emitting cell.

14. The device according to claim 11, wherein the second light emitting cell has a longer lighting distance than the first light emitting cell.

15. The device according to claim 12, wherein the controller is configured to turn off the first light emitting cell and the second light emitting cell in response to the object detection signal, and further configured to turn off another second light emitting cell adjacent to the first light emitting cell.

16. The device according to claim 12, wherein the controller is configured to turn off the second light emitting cell in response to the object detection signal.

17. The device according to claim 1, wherein, in response to the object detection signal indicating that a detected object disappears, the controller is configured to allow the light emitting cells in a turned-off state to return to an original state before a detection of the object.

18. The device according to claim 1, wherein a distance between adjacent light emitting structures is in a range of 20 µm to 50 µm.

19. The device according to claim 1, wherein each of the light emitting structure includes a first conductivity type semiconductor layer, a second conductivity type semiconductor layer, an active layer disposed between the first conductivity type semiconductor layer and the second conductivity type semiconductor layer.

20. The device according to claim 1, wherein a surface of the wavelength converter that is in contact with a surface of the light emitting structure has a size smaller than the surface of the light emitting structure.

* * * * *